(12) United States Patent
Nariya

(10) Patent No.: US 11,484,971 B2
(45) Date of Patent: Nov. 1, 2022

(54) MANUFACTURING DEVICE FOR MASK UNIT

(71) Applicant: Japan Display Inc., Tokyo (JP)

(72) Inventor: Mototsugu Nariya, Tokyo (JP)

(73) Assignee: Japan Display Inc., Tokyo (JP)

( * ) Notice: Subject to any disclaimer, the term of this patent is extended or adjusted under 35 U.S.C. 154(b) by 641 days.

(21) Appl. No.: 16/515,115

(22) Filed: Jul. 18, 2019

(65) Prior Publication Data

US 2020/0030913 A1 Jan. 30, 2020

(30) Foreign Application Priority Data

Jul. 25, 2018 (JP) .............................. JP2018-139301

(51) Int. Cl.
| | |
|---|---|
| *H01L 21/67* | (2006.01) |
| *C23C 14/04* | (2006.01) |
| *B23K 26/21* | (2014.01) |
| *H01L 51/00* | (2006.01) |

(52) U.S. Cl.
CPC ............ *B23K 26/21* (2015.10); *C23C 14/042* (2013.01); *H01L 51/0011* (2013.01)

(58) Field of Classification Search
CPC ...... H01L 21/68742; H05K 2203/0186; G03F 7/70691; B23K 2101/40
See application file for complete search history.

(56) References Cited

U.S. PATENT DOCUMENTS

| 6,062,852 A * | 5/2000 | Kawamoto ....... H01L 21/68728 432/259 |
| 9,409,248 B2 * | 8/2016 | Ootake ................. B23K 37/04 |
| 2004/0051220 A1 * | 3/2004 | Hunger ............ H01L 21/68742 269/13 |
| 2005/0155823 A1 * | 7/2005 | Hiroki ................ H01L 21/6875 187/401 |

(Continued)

FOREIGN PATENT DOCUMENTS

| CN | 101533225 A | 9/2009 |
| JP | 2006-265712 A | 10/2006 |

OTHER PUBLICATIONS

Chinese Office Action dated May 31, 2021 issued in Chinese Application No. 201910634499.4, with English machine translation.

*Primary Examiner* — Helena Kosanovic
*Assistant Examiner* — Lawrence H Samuels
(74) *Attorney, Agent, or Firm* — Michael Best & Friedlich LLP

(57) ABSTRACT

A manufacturing device for mask unit having a mask frame and a mask fixed to the mask frame includes a stage including a frame holding stage, and an alignment stage arranged with a plurality of lift-pins, a holding part for holding a reference plate arranged facing the stage, a mask holding unit, the mask holding unit being arranged between the stage and the reference plate, and a camera for imaging a direction of the stage passing through the reference plate, wherein the mask holding unit holds the mask at a surface (Continued)

on the frame side, the mask holding unit rises and falls above the alignment stage by the plurality of the lift-pins, the plurality of lift-pins includes a plurality of first lift-pins capable of contacting the mask holding unit, and the camera images a first reference marker on the mask and a second reference marker on the reference plate.

14 Claims, 12 Drawing Sheets

(56) References Cited

U.S. PATENT DOCUMENTS

| | | | |
|---|---|---|---|
| 2008/0110397 A1* | 5/2008 | Son | H01L 21/68742 74/567 |
| 2011/0174217 A1* | 7/2011 | Gersdorff | C23C 16/4586 118/500 |
| 2011/0236162 A1* | 9/2011 | Shikayama | H01L 21/68742 414/222.01 |
| 2012/0237682 A1* | 9/2012 | Hong | C23C 14/042 118/712 |
| 2015/0243542 A1* | 8/2015 | Yoshihara | H01L 21/67051 156/345.23 |
| 2017/0217017 A1* | 8/2017 | Sakaue | H01L 21/67259 |
| 2017/0233861 A1* | 8/2017 | Bucci | C23C 14/042 427/8 |
| 2019/0226076 A1* | 7/2019 | Bucci | C23C 14/54 |
| 2019/0323117 A1* | 10/2019 | Ikenaga | H05B 33/10 |
| 2019/0345596 A1* | 11/2019 | Kataoka | H05B 33/10 |

\* cited by examiner

MANUFACTURING DEVICE FOR MASK UNIT

CROSS REFERENCE TO RELATED APPLICATIONS

This application is based upon and claims the benefit of priority from the prior Japanese Patent Application No. 2018-139301, filed on Jul. 25, 2018, the entire contents of which are incorporated herein by reference.

FIELD

An embodiment of the present invention is related to a manufacturing device of a mask unit in which a mask is fixed to a frame.

BACKGROUND

A light emitting element is arranged in each pixel of a display device and an image is displayed by individually controlling emitted light. For example, in an organic EL display which uses an organic EL element as a light emitting element, an organic EL element is arranged in each pixel, and the organic EL element has a structure in which a layer (referred to as "organic EL layer" below) including an organic EL material is sandwiched between a pair of electrodes consisting of an anode electrode and a cathode electrode. The organic EL layer is formed from functional layers such as a light emitting layer, an electron injection layer and a hole injection layer, and it is possible to emit light of colors of various wavelengths by selecting these organic materials.

A vapor deposition method is used in the formation of a thin film of an organic EL element which uses a low molecular weight compound as a material. In the vapor deposition method, a vapor deposition material is heated and sublimated by a heater, and a thin film is formed by vapor deposition on the surface of a substrate. At this time, a fine thin film pattern is formed through an opening of a mask using a mask which is arranged with a large number of fine opening patterns.

The mask is used as a mask unit which is fixed to frame having rigidity. For example, Japanese Laid-Open Patent Application No. 2006-265712 discloses a method of fixing a mask having a region which is extremely thin and different in rigidity to a frame in a flat state with no distortion or sag by holding a mask arranged with a region which is extremely thin and has differences in rigidity with tension using a plurality of clamps.

SUMMARY

A manufacturing device for mask unit having a mask frame and a mask fixed to the mask frame related to one embodiment of the present invention includes a stage including a frame holding stage for holding the frame, and an alignment stage arranged with a plurality of lift-pins, a holding part for holding a reference plate arranged facing the stage, a mask holding unit for holding the mask, the mask holding unit being arranged between the stage and the reference plate, and a camera for imaging a direction of the stage passing through the reference plate, wherein the mask holding unit holds the mask at a surface on the frame side, the mask holding unit rises and falls above the alignment stage by the plurality of lift-pins, the plurality of lift-pins includes a plurality of first lift-pins capable of contacting the mask holding unit, and the camera images a first reference marker formed on the mask and a second reference marker formed on the reference plate.

DESCRIPTION OF EMBODIMENTS

Figure 1A:
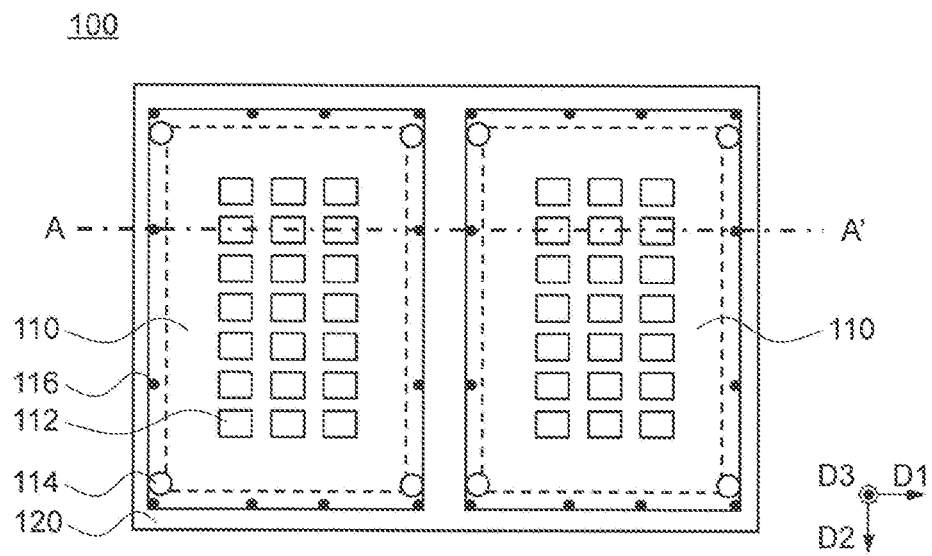
FIG. 1A is a top view diagram showing a schematic structure of a mask unit related to one embodiment of the present invention.

The embodiments of the present invention are explained below while referring to the drawings. However, the present invention can be implemented in many different modes without and should not to be interpreted as being limited to the description of the embodiments exemplified below. Although the drawings may be schematically represented in terms of width, thickness, shape, and the like of each part as compared with their actual mode in order to make explanation clearer, it is only an example and an interpretation of the present invention is not limited. In addition, in the present specification and each drawing, the same symbols (or symbols attached with a, b and the like after a numeral) are provided to the same elements as those described above with reference to preceding figures and a detailed explanation may be omitted accordingly. Furthermore, characters attached with [first] and [second] to each element are convenient symbols used in order to distinguish each element and do not have any further meaning unless otherwise explained.

In the present specification, in the case where certain parts or regions are given as "above (or below)" other parts or regions, as long as there is no particular limitation, these include parts which are not only directly above (or directly below) other parts or regions but also in an upper direction (or lower direction). That is, this includes the case where other structural elements may be included between other parts or regions in an upper direction (or lower direction). Furthermore, in the explanation herein, unless otherwise stated, in a cross-sectional view, a side on which a camera is arranged with respect to a stage is referred to as "above" or "upper", and a surface seen from "above" or "upper" is referred to as "top surface" or "upper surface side" and the reverse is referred to as "below", "under", "bottom" surface or "bottom surface side".

In the explanation herein, when the directions D1, D2 and D3 are shown in a diagram, the direction D1 and the direction D2 intersect and the directions D1 and D2 intersect the direction D3.

FIRST EMBODIMENT

<Schematic Structure of Mask Unit>

Figure 1B:
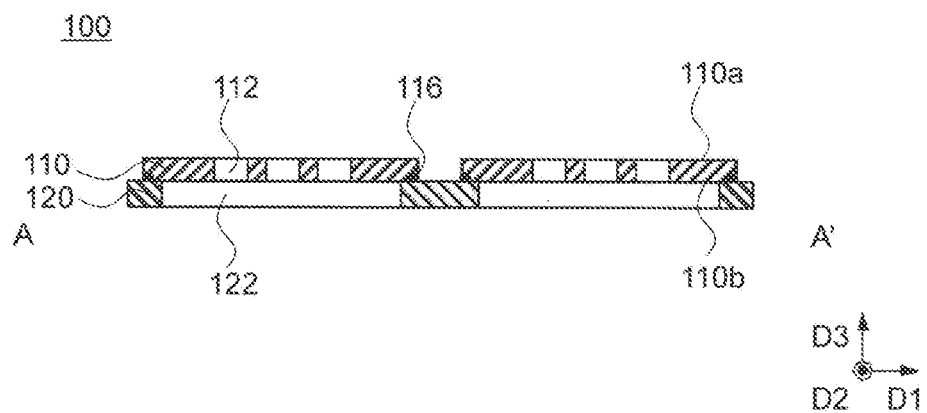
FIG. 1B is a cross-sectional diagram showing a schematic structure of a mask unit related to one embodiment of the present invention.

FIG. 1A and FIG. 1B show a schematic structure of a mask unit 100 related to one embodiment of the present invention. FIG. 1A is a planar view diagram of the mask unit 100. FIG. 1B is a cross-sectional diagram of the line A-A' in FIG. 1A.

The mask unit 100 related to the present embodiment is arranged with a mask 110 and a frame 120. The mask 110 includes a mask pattern part 112. The mask pattern part 112 has a plurality of fine opening patterns (film formation patterns), and a fine thin film pattern is formed via the mask pattern part 112 which is used for vapor deposition. The shape and arrangement of the mask pattern part 112 are arbitrary, and for example, elongated slit shaped openings can be arranged in parallel, and rectangular openings can be arranged longitudinally and also in parallel. For example, in the case where a plurality of display panels is manufactured above one substrate, the mask 110 includes a mask pattern part 112 corresponding to a film formation pattern at each position corresponding to the plurality of display panels. Therefore, by using the mask unit 100 related to the present embodiment, it is possible to collectively form a thin film formed from a low molecular weight compound with respect to a plurality of display panels. In the present embodiment, the mask 110 has a rectangular mask pattern part 112 on substantially the entire surface at a position corresponding to a display panel. However, the present invention is not limited to this embodiment and the mask pattern part 112 can have an arbitrary shape in accordance with a film formation pattern. The mask 110 can use, for example, a film shaped metal having a thickness of 3 µm to 20 µm formed from a magnetic metal such as nickel, a nickel alloy or invar. It is more preferable that the mask 110 is a metal film (metal sheet) arranged with invar characteristics which has a small thermal expansion coefficient and is not easily affected by heat. The mask 110 may also be arranged with regions which have different thicknesses.

In the present embodiment, the mask 110 has a rectangular shape and first reference marks 114 are provided at the four corners. This is an alignment mark on the mask side which is used for alignment between a reference plate and the mask 110 when manufacturing the mask unit 100 described herein. In addition, it can also be used for alignment between a substrate which serves as a vapor deposition object and the mask unit 100 at the time of vapor deposition.

The mask 110 is fixed to the frame 120 at a fixing point 116 by spot welding or the like. The mask 110 includes a plurality of fixed points 116 at an outer periphery thereof. The plurality of fixed points 116 are preferably formed at least on one side of the mask 110 and on the opposite side. Forming the plurality of fixed points 116 on each of the four sides of the mask 110 is more preferable. The frame 120 is a frame shaped member which holds the outer periphery part of the mask 110 and is formed from a material having a small thermal expansion coefficient such as Invar for example. The frame 120 has at least openings 122 at positions which correspond to a plurality of display panels of the mask 110. That is, in a planar view, the mask pattern part 112 of the mask 110 is arranged on the inner side of the opening 122 of the frame 120. The external size of the mask 110 is larger than the radius of the opening 122 of the frame 120 and smaller than the external size of the frame 120. In the present embodiment, two masks 110 are arranged in one frame 120. In addition, 12 fixed points 116 are formed for each mask 112. However, the present invention is not limited to this embodiment and the number of masks 110 and fixed points 116 can be set to any number.

As is shown in FIG. 1B, the mask 110 includes a first surface 110a which faces the object to be formed, and a second surface 110b which contacts the frame 120 on the opposite side to the first surface 110a. The first surface 110a of the mask 110 is preferred to be substantially flat. On the other hand, the second surface 110b of the mask 110 may also have a concave/convex structure. By providing the second surface 110b of the mask 110 with a concave/convex structure, it becomes easier to remove any attached matter by cleaning at the time of maintenance of the mask 110.

<Mask Unit Manufacturing Device>

Figure 2A:
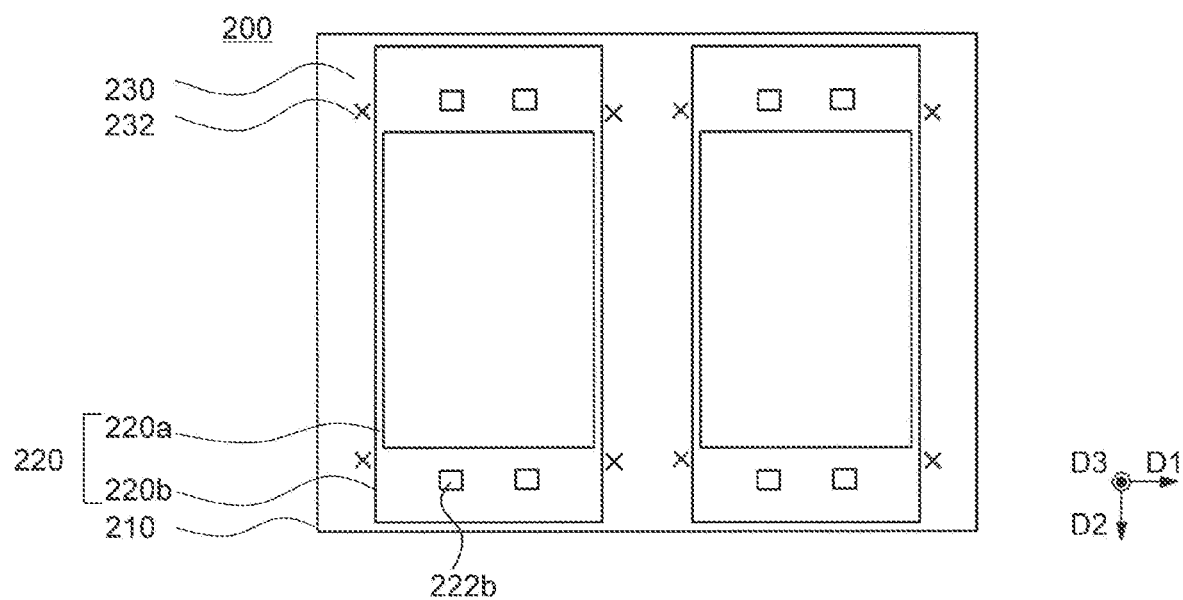
FIG. 2A is a top view diagram showing a schematic structure of a manufacturing device of a mask unit related to one embodiment of the present invention.
Figure 2B:
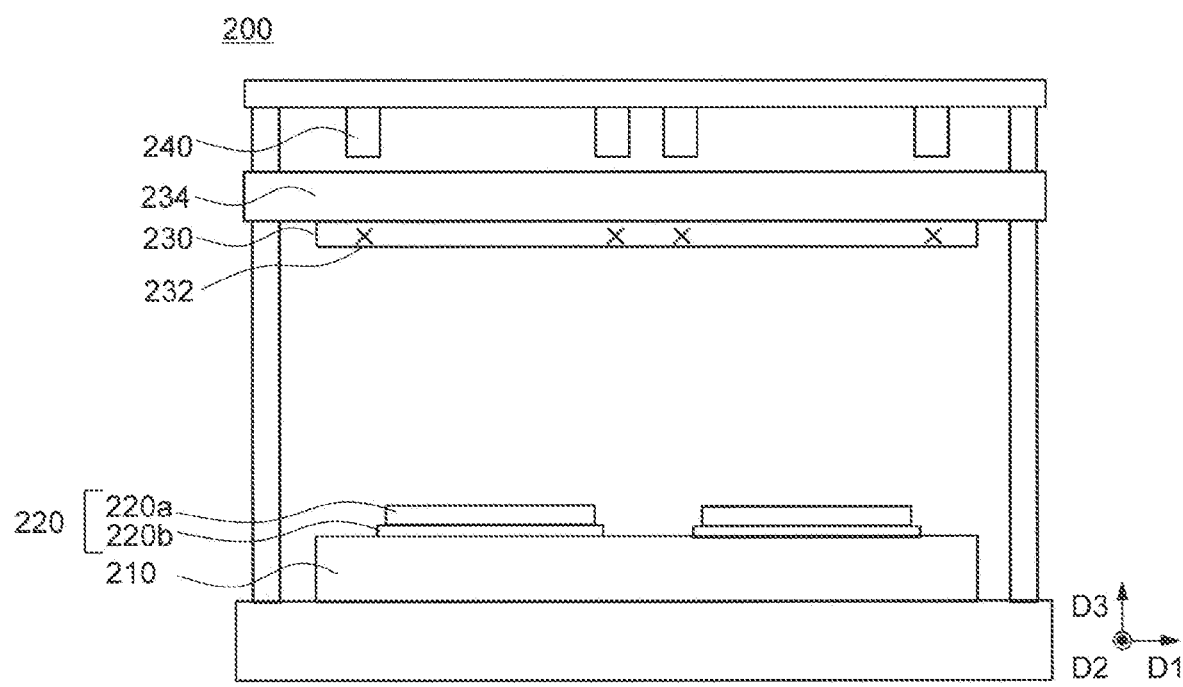
FIG. 2B is a cross-sectional diagram showing a schematic structure of a manufacturing device of a mask unit related to one embodiment of the present invention.

Next, a manufacturing method and a manufacturing device of the mask unit 100 are explained. FIG. 2A and FIG. 2B show a schematic structure of a mask unit manufacturing device 200 related to one embodiment of the present invention. FIG. 2A is a top view diagram of the mask unit manufacturing device 200. FIG. 2B is a side view diagram of the mask unit manufacturing device 200.

The mask unit manufacturing device 200 related to the present embodiment is arranged with a stage 210, a mask holding unit 220, a support 234 for supporting a reference plate 230 and a camera 240. The stage 210 has a flat surface in the direction D1-D2. The mask holding unit 220 is arranged on the surface of the stage 210. In the present embodiment, two mask holding units 220 are arranged on one stage 210. However, the present invention is not limited to this number and the number of mask holding units 220 may also correspond to the number of mask 110. In a planar view, the area of the mask holding unit 220 is smaller than the area of the stage 210.

In the present embodiment, the mask holding unit 220 holds the first surface 110a of the mask 110 from the opposite side (reverse direction of D3) to the stage 210 of the mask 110 using magnetism. As a result, the mask holding unit 220 is arranged with a magnetic field generator 220a and a contact plate 220b. In the present embodiment, the magnetic field generator 220a is an electromagnet. Since the magnetic field generator 220a is an electromagnet, it has a function for controlling at least two states, a state in which a magnetic force is applied and a state in which a magnetic force is not applied to a mask by an electrical or mechanical method. However, the present invention is not limited to this embodiment, and a permanent magnet may also be used as the magnetic field generator 220a instead of an electromagnet. The mask holding unit 220 holds the mask 110 on the stage 210 side of the mask holding unit 220. Therefore, the contact plate 220b is arranged on the side of the stage 210 which is in contact with the mask 110 of the mask holding unit 220. The contact plate 220b can be formed using a plate shaped material such as stainless steel or invar with a thickness of 1 mm to 50 mm for example. It is more preferable that the contact plate 220b is formed from a material having a small thermal expansion coefficient. By using a material with a small thermal expansion coefficient for the contact plate 220b, it is possible to suppress misalignment between the mask 110 and the frame 120 due to a temperature change over time when manufacturing the mask unit 100. However, the present invention is not limited to this embodiment and as long as the contact plate 220b may be substantially flat and may pass the magnetic force of the magnetic field generator 220a. Furthermore, the contact plate 220b is arranged with an opening 222b at a position of a fixing point 116 in order to enable welding of the mask 110 and the frame 120 described herein. Although an example in which the mask holding unit 220 includes the magnetic field generator 220a and the contact plate 220b is shown in the present embodiment, the present invention is not limited to this example, and the contact plate 220b may be omitted. In addition, the magnetic field generator 220a and the contact plate 220b may also be formed as an integral unit. When the magnetic field generator 220a and the contact plate 220b are not distinguished from one another, they are called a mask holding unit 220. By adopting this structure, it is possible for the mask holding unit 220 to hold the first surface 110a of the mask 110 flat in a reverse direction of D3.

A support part 234 which supports the reference plate 230 is arranged on the opposite side to the stage 210 of the mask holding unit 220 (the direction D3 intersecting the direction D1-D2). The support part 234 detachably supports the reference plate 230. The reference plate 230 can be installed in advance in the mask unit manufacturing device 200, or can be appropriately installed in the support part 234 according to the specifications of the mask unit. The area of the reference plate 230 is larger than the area of the mask holding unit 220 in a planar view. A second reference mark 232 corresponding to the first reference mark 114 of the mask 110 is arranged in the reference plate 230. These are alignment marks on the side of the reference plate 230 which are used for alignment between the reference plate 230 and the mask 110 when the mask unit 100 is manufactured as is described herein. The second reference mark 232 of the reference plate 230 is arranged further in the direction D1 or in the reverse direction D1 than a position corresponding to the mask holding unit 220. That is, when seen in a planar view, the second reference mark 232 of the reference plate 230 is outside in the direction D1 or the reverse direction D1 than the mask holding unit 220. In the present embodiment, the material of the reference plate 230 is a plate shaped glass with a thickness of 4 mm to 20 mm. However, the present invention is not limited to this embodiment as long as the reference plate 230 may have permeability. It is more preferable that the material of reference plate 230 having a small thermal expansion coefficient. When the reference plate 230 is a material having a small thermal expansion coefficien, it is possible to suppress a misalignment of the second reference mark 232 due to a temperature change over time when the mask unit 100 is manufactured.

The camera 240 is arranged at a position which corresponds to the second reference mark 232 on the opposite side of the stage 210 of the reference plate 230 (direction D3). The camera 240 images the position of the second reference mark 232 and the first reference mark 114 through the reference plate 230 when aligning the reference plate 230 and the mask 110.

Figure 3A:
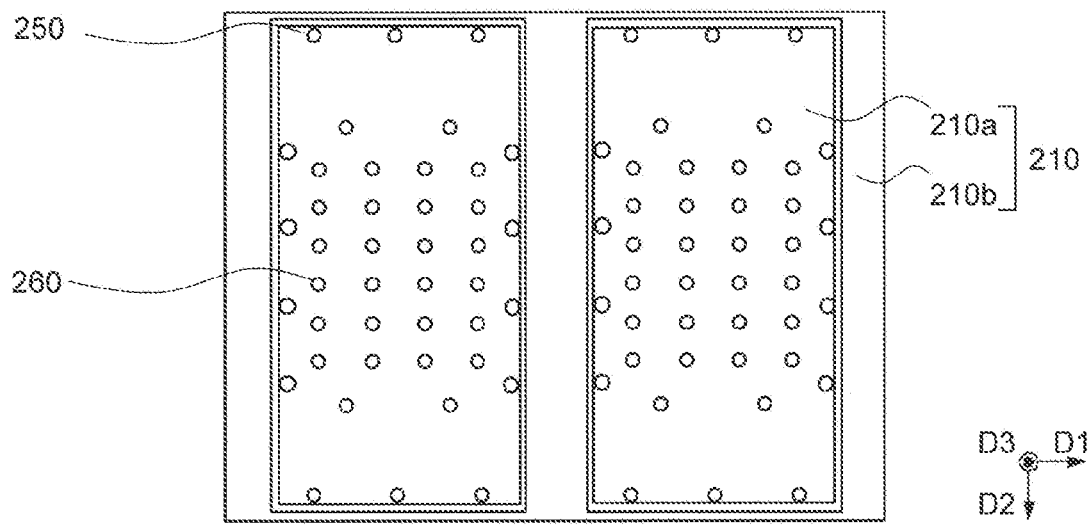
FIG. 3A is a top view diagram showing a structure of a stage in a manufacturing device of a mask unit related to one embodiment of the present invention.
Figure 3B:
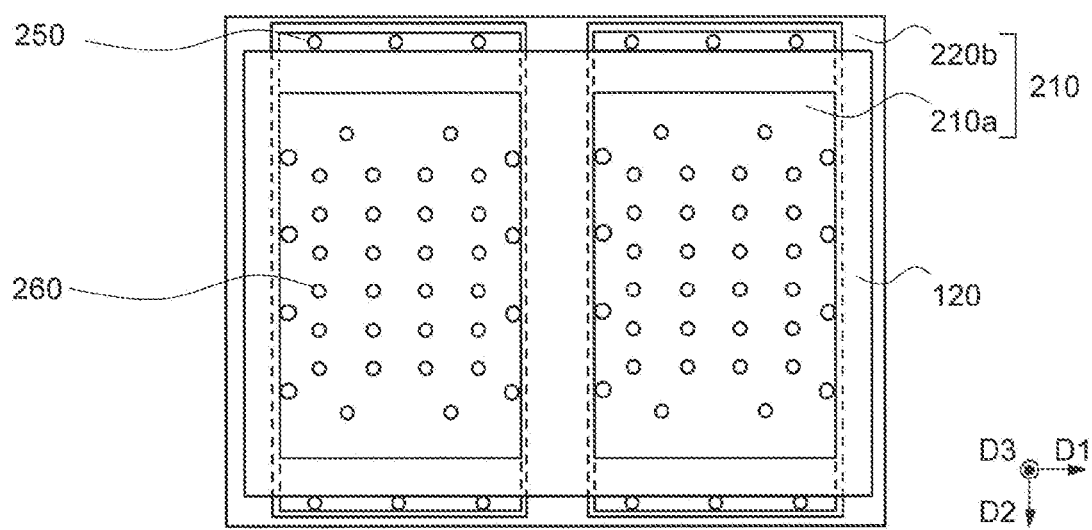
FIG. 3B is a top view diagram showing a structure of a stage in a manufacturing device of a mask unit related to one embodiment of the present invention.

Next, the structure of the stage 210 is explained in more detail. FIG. 3A and FIG. 3B show the structure of a stage of the mask unit manufacturing device related to one embodiment of the present invention. FIG. 3A is a top view diagram of the stage 210. FIG. 3B is a top view diagram of the stage 210 arranged with the frame 120.

The stage 210 of the mask unit manufacturing device 200 related to the present embodiment is arranged with an alignment stage 210a and a frame holding stage 210b. The stage 210 in the present embodiment is arranged with two rectangular shaped alignment stages 210a and one frame shaped frame holding stage 210b which surrounds the alignment stages 210a. However, the number of alignment stages 210a is not limited and may correspond to the number of masks 110. The number of frame holding stage 210b is also not limited and may correspond to the number of frame holding stages 210b.

The frame holding stage 210b includes a plane in the direction D1-D2 and holds the frame 120 described herein. The frame 120 is fixed to the mask unit manufacturing device 200 in parallel with the D1-D2 plane by the frame holding stage 210b.

The two alignment stages 210a can each move independently in the D1-D2 plane direction (including a rotational direction) with respect to the frame holding stage 210b. There is a gap between the alignment stage 210a and the frame holding stage 210b, so that the alignment stage 210a can move with respect to the frame holding stage 210b within the range of the gap.

The alignment stage 210a is arranged with a plurality of first lift pins 250 and a plurality of second lift pins 260. In the alignment stage 210a, the plurality of first lift pins 250 can be arranged on the outer side of the frame 120 and can contact the mask holding unit 220 when moving up and down in the direction D3. A magnet or the like may also be arranged at the tip end of the plurality of first lift pins 250 in contact with the contact plate 220b in order to stably hold the contact plate 220b. In the alignment stage 210a, the plurality of second lift pins 260 can be arranged on the inner side of the opening 122 of the frame 120 and can contact the mask 110 described herein when the plurality of second lift pins 260 move up and down in the direction D3. A magnet or the like may also be arranged at the tip end of the plurality of second lift pins 260 in contact with the mask 110 in order to stably hold the mask 110. By adopting this structure, the mask holding unit 220 and the mask 110 can move parallel with respect to the frame 120 (the rotational direction with the plane direction D1-D2 and the direction D3 as axes) using the alignment stage 210a, the first lift pins 250 and the second lift pins 260. The position and movement of the plurality of first lift pins 250 and the plurality of second lift pins 260 are explained in detail herein.

According to the manufacturing device of the mask unit 100 in the present embodiment, it is possible to align a mask with high accuracy and fix the mask to a frame by the alignment stage 210a, the first lift pins 250 and the second lift pins 260.

<Operation of Mask Unit Manufacturing Device and Manufacturing Method of Mask Unit>

Figure 4A:
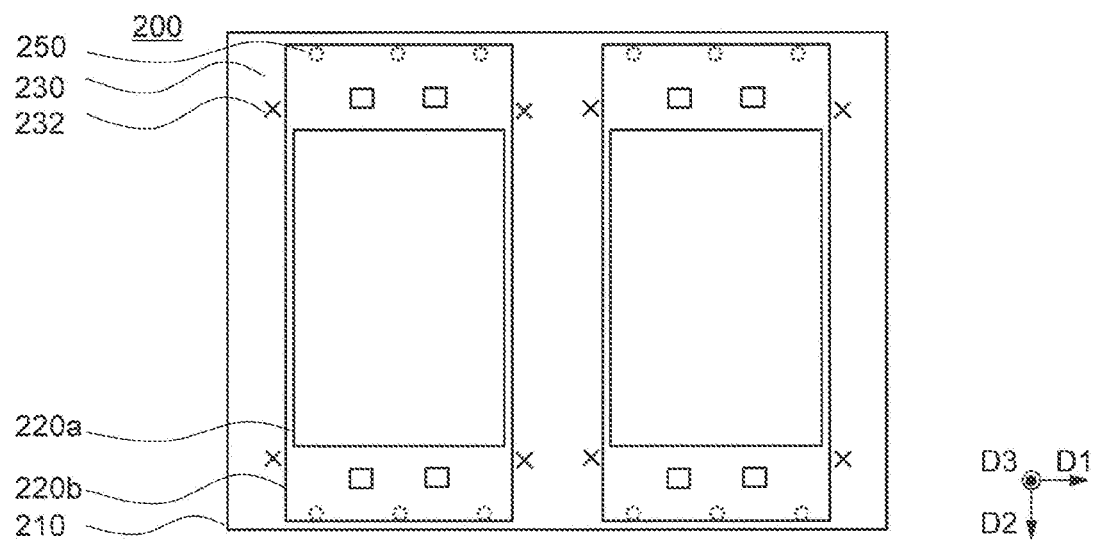
FIG. 4A is a top view diagram showing a manufacturing method of a mask unit related to one embodiment of the present invention.

FIG. 4A to FIG. 9B show a manufacturing method of a mask unit related to one embodiment of the present invention. FIG. 4A is a top view diagram of the mask unit manufacturing device 200 in a state when the mask holding unit 220 is raised. FIG. 4B is a side view diagram of the mask unit manufacturing device 200 in the same state.

Figure 4B:
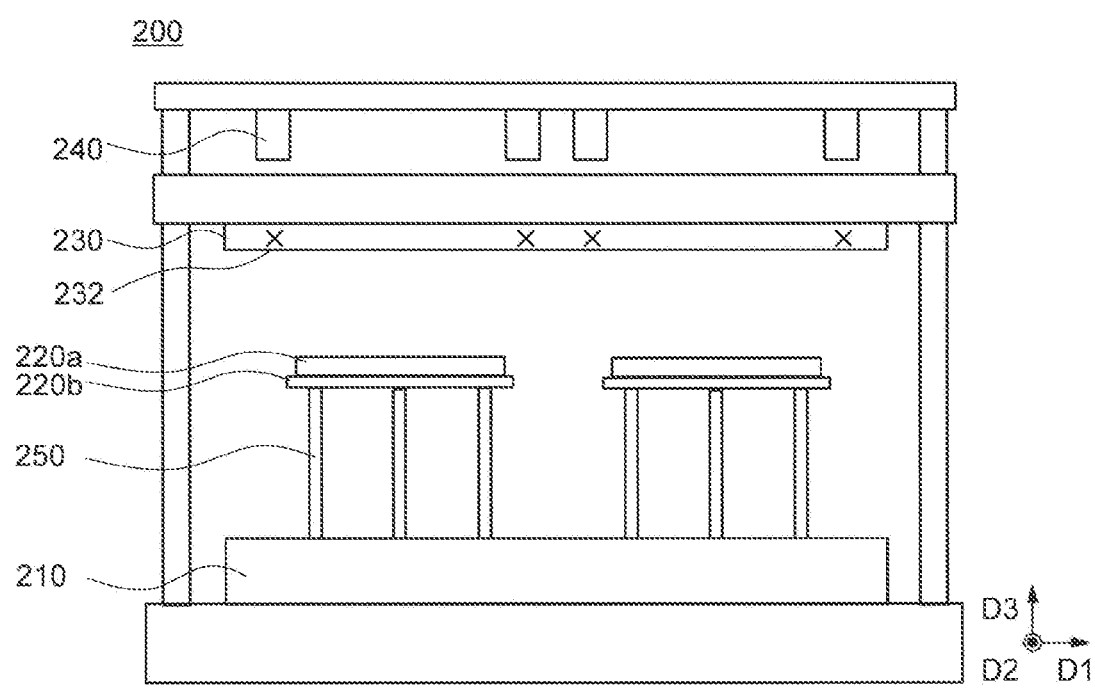
FIG. 4B is a side view diagram showing a manufacturing method of a mask unit related to one embodiment of the present invention.

As is shown in FIG. 4A and FIG. 4B, the stage 210 (alignment stage 210a) is arranged with a plurality of first lift pins 250. The first lift pins 250 move up from the alignment stage 210a in the direction D3 and contact the contact plate 220b of the mask holding unit 220. Furthermore, the first lift pins 250 raise the mask holding unit 220 whereby a space is formed between the stage 210 and the mask holding unit 220. In the present embodiment, the first lift pins 250 are arranged along the direction D1 at one end of the alignment stage 210a in the direction D2 and at opposite end respectively. The plurality of first lift pins 250 move up and down in synchronization in the direction D3 from the alignment stage 210a. By adopting this structure, the first lift pins 250 can be arranged on the outer side of the frame 120 described herein, and can raise the mask holding unit 220 parallel to the D1-D2 plane in the direction D3.

Figure 5A:
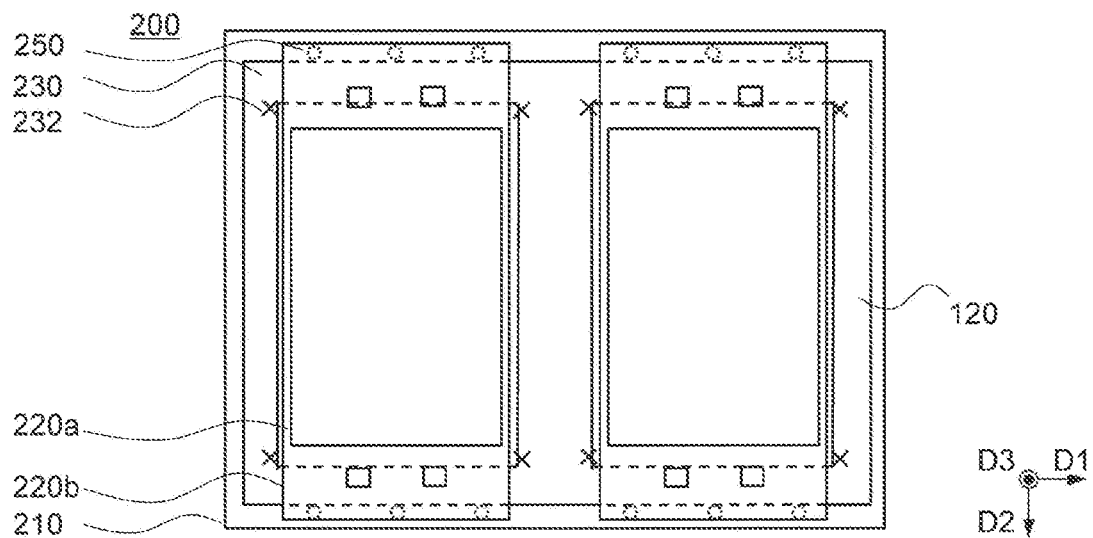
FIG. 5A is a top view diagram showing a manufacturing method of a mask unit related to one embodiment of the present invention.
Figure 5B:
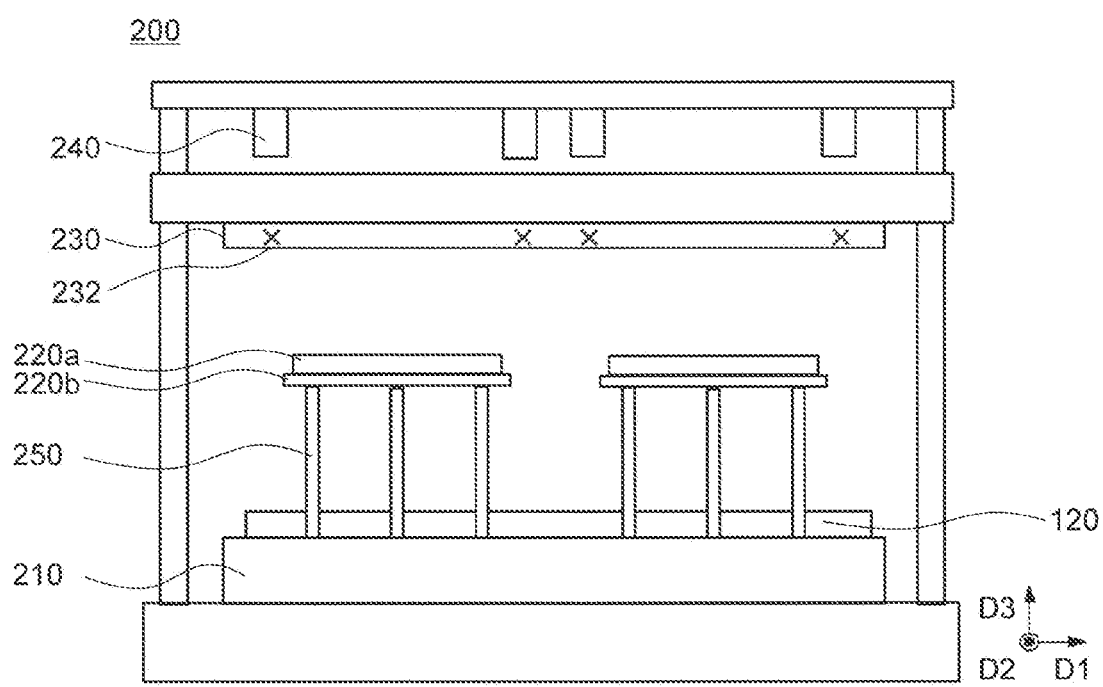
FIG. 5B is a side view diagram showing a manufacturing method of a mask unit related to one embodiment of the present invention.

FIG. 5A is a top view diagram of the mask unit manufacturing device 200 in a state when the frame 120 is put on the stage 210. FIG. 5B is a side view diagram of the mask unit manufacturing device 200 in the same state.

As is shown in FIG. 5A and FIG. 5B, the frame 120 is put between the stage 210 and the mask holding unit 220 of the mask unit manufacturing device 200. The frame 120 is put into the space which is surrounded by the stage 210, the plurality of first lift pins 250 and the mask holding unit 220 from the direction D1. That is, the outer dimensions of the contact plate 220b of the mask holding unit 220 are larger than the outer dimensions of the frame 120 in the direction D2.

The frame 120 is arranged at a position where the opening 122 of the frame 120 corresponds to the magnetic field generator 220a of the mask holding unit 220 by an alignment mechanism (not shown in the diagram). That is, when seen in a planar view, the magnetic field generator 220a of the mask holding unit 220 is arranged in the opening 122 of the frame 120. When seen in a planar view, the magnetic field generator 220a and the contact plate 220b of the mask holding unit 220 expose the position of the fixing point 116 in order to be able to weld at least the mask 110 and the frame 120 described herein. In addition, the mask holding unit 220 is located at a position where at least the mask 110 and the frame 120 overlap each other in a planar view. It is preferred that a part of mask holding unit 220 is larger than the opening 122 so that the mask 110 is pressed so as to adhere to the frame 120 in a region except the fixing point 116. The inserted frame 120 is fixed to the frame holding stage 210b using a clamp or a magnet.

Figure 6A:
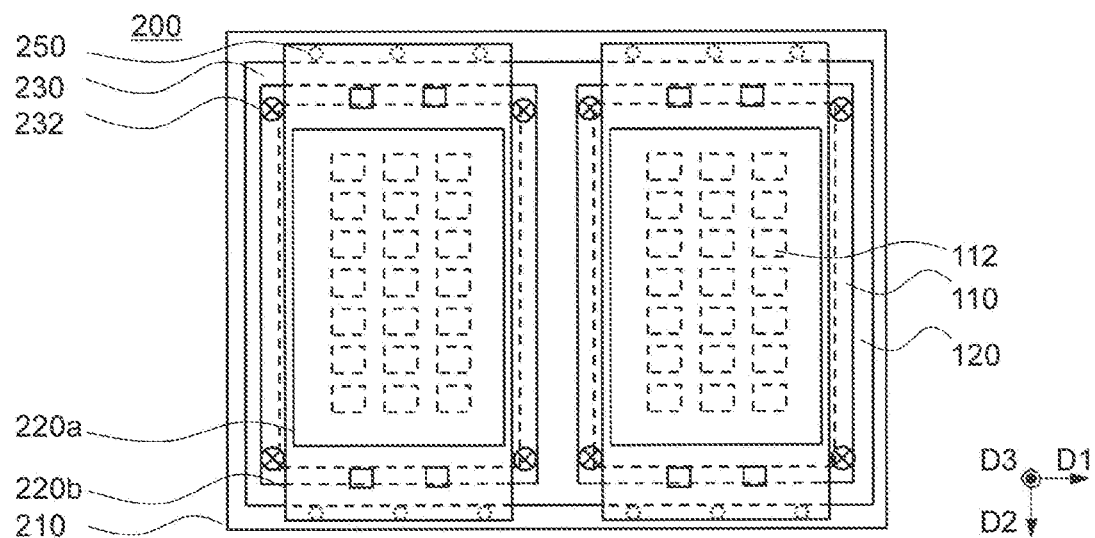
FIG. 6A is a top view diagram showing a manufacturing method of a mask unit related to one embodiment of the present invention.
Figure 6B:
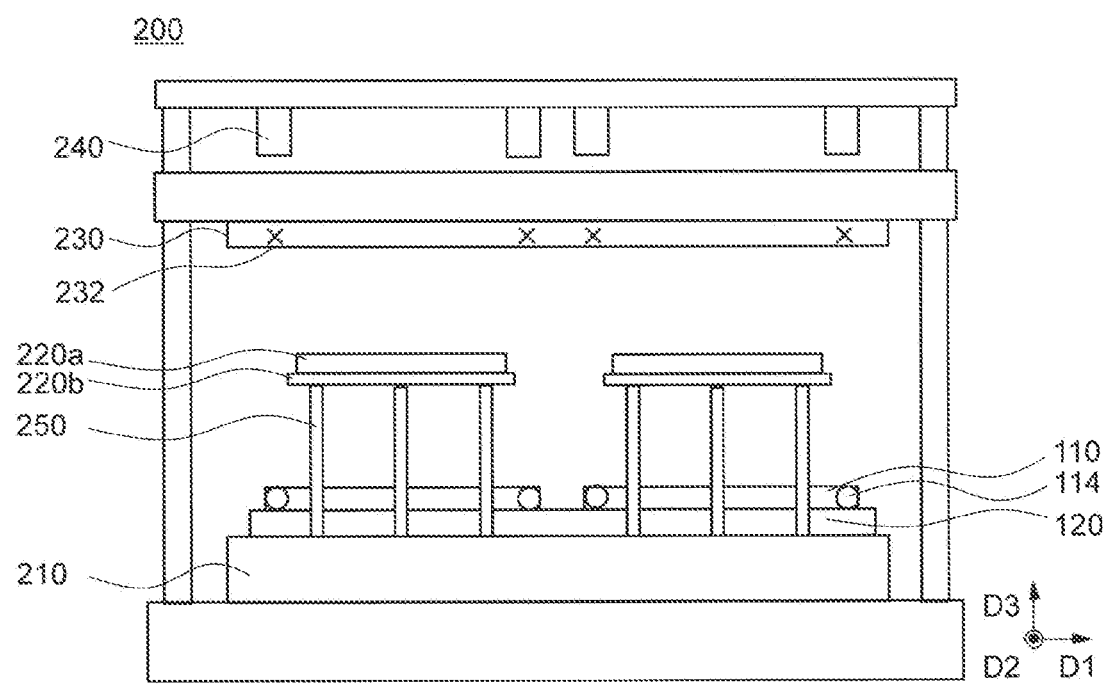
FIG. 6B is a side view diagram showing a manufacturing method of a mask unit related to one embodiment of the present invention.

FIG. 6A is a top view diagram of the mask unit manufacturing device 200 in a state in where the mask 110 is transported between the frame 120 and the mask holding unit 220. FIG. 6B is a side view diagram of the mask unit manufacturing device 200 in the same state.

As is shown in FIG. 6A and FIG. 6B, the mask 110 is inserted between the frame 120 which is held by the frame holding stage 210b and the mask holding unit 220. The mask 110 is inserted into the space which is surrounded by the frame 120, the plurality of first lift pins 250 and the mask holding unit 220 from the direction D1. That is, the outer dimensions of the contact plate 220b of the mask holding unit 220 are larger than the outer dimensions of the mask 110 in the direction D2. When seen in a planar view, the mask 110 is arranged so as to cover the opening 122 of the frame 120. The area of the magnetic field generator 220a of the mask holding unit 220 is smaller than the area of the mask 110. In addition, the outer dimensions of the magnetic field generator 220a of the mask holding unit 220 are smaller than the outer dimensions of the mask 110. The mask pattern part 112 of the mask 110 is arranged at a position which corresponds to the magnetic field generator 220a of the mask holding unit 220. That is, when seen in a planar view, the mask pattern part 112 of the mask 110 is arranged at the position of the magnetic field generator 220a of the mask holding unit 220. In addition, the outer dimensions of the contact plate 220b of the mask holding unit 220 may be smaller than the outer dimensions of the mask 110 in the direction D1. When seen in a planar view, the magnetic field generator 220a and the contact plate 220b of the mask holding unit 220 expose the position of the fixing point 116 in order to be able to weld of at least the mask 110 and the frame 120 described herein.

The first reference mark 114 of the mask 110 is arranged further in the direction D1 and the reverse direction D1 than the position which corresponds to the mask holding unit 220. That is, when seen in a planar view, the magnetic field generator 220a and the contact plate 220b of the mask holding unit 220 expose at least the first reference mark 114 of the mask 110.

Figure 7A:
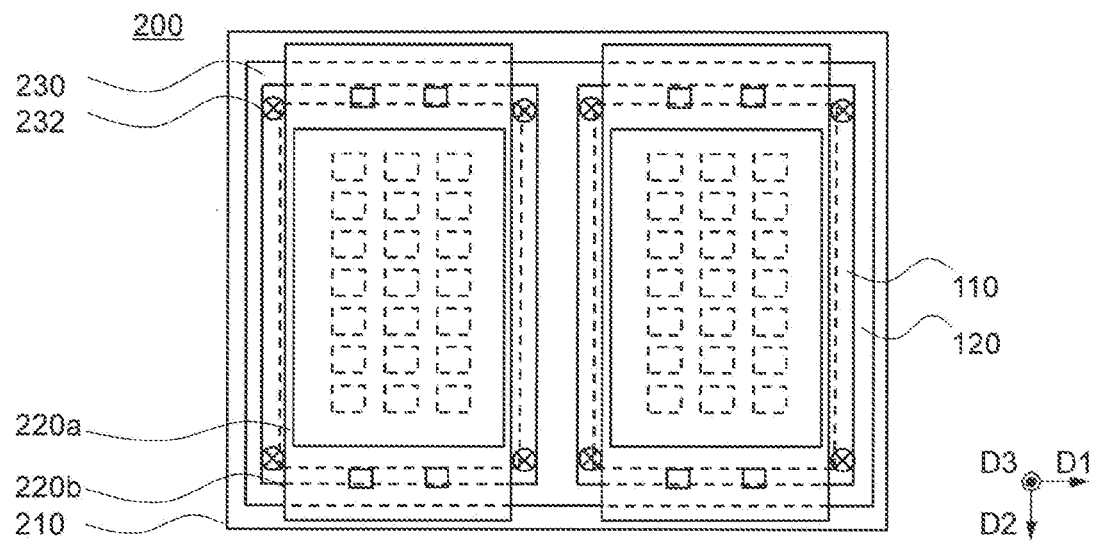
FIG. 7A is a top view diagram showing a manufacturing method of a mask unit related to one embodiment of the present invention.
Figure 7B:
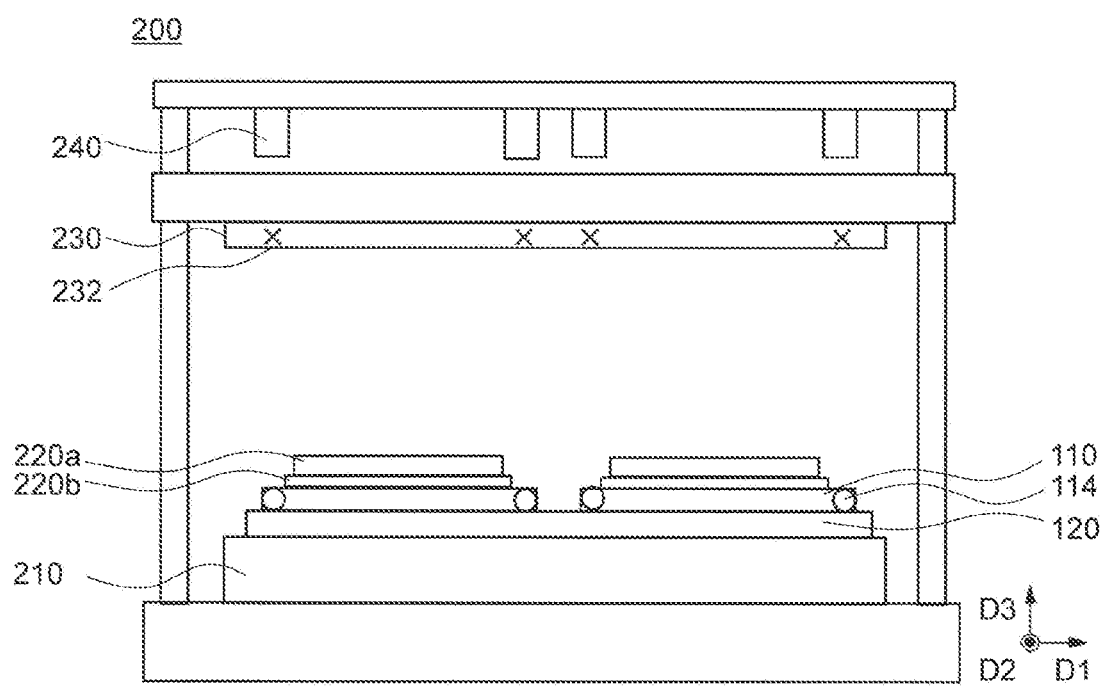
FIG. 7B is a side view diagram showing a manufacturing method of a mask unit related to one embodiment of the present invention.

FIG. 7A is a top view diagram of the mask unit manufacturing device 200 in a state when the mask holding unit 220 is lowered to a position where the mask 110 can be adsorbed. FIG. 7B is a side view diagram of the mask unit manufacturing device 200 in the same state.

The transported mask 110 is held by the mask holding unit 220. As is shown in FIG. 7A and FIG. 7B, the mask holding unit 220 drops in the reverse direction D3 by lowering of the first lift pins 250. Here, the contact plate 220b of the mask holding unit 220 contacts the first surface 110a of the mask 110. That is, the mask 110 contacts the stage 210 side of the contact plate 220b. The mask holding unit 220 holds the mask 110 from the first surface 110a side (reverse direction of D3) via the contact plate 220b by the magnetic force of the magnetic field generator 220a. As a result, it is preferred that the contact plate 220b and the first surface 110a of the mask 110 are substantially flat. By adopting this structure, it is possible for the mask holding unit 220 to hold the mask 110 substantially flat. Since it is not necessary to apply tension to make the mask 110 flat, it is possible to reduce problems such as distortion of the mask 110 caused by tension. In addition, since it is not necessary to hold the mask 110 in the direction D1-D2, it is possible to save space and tile of a plurality of masks.

Figure 8A:
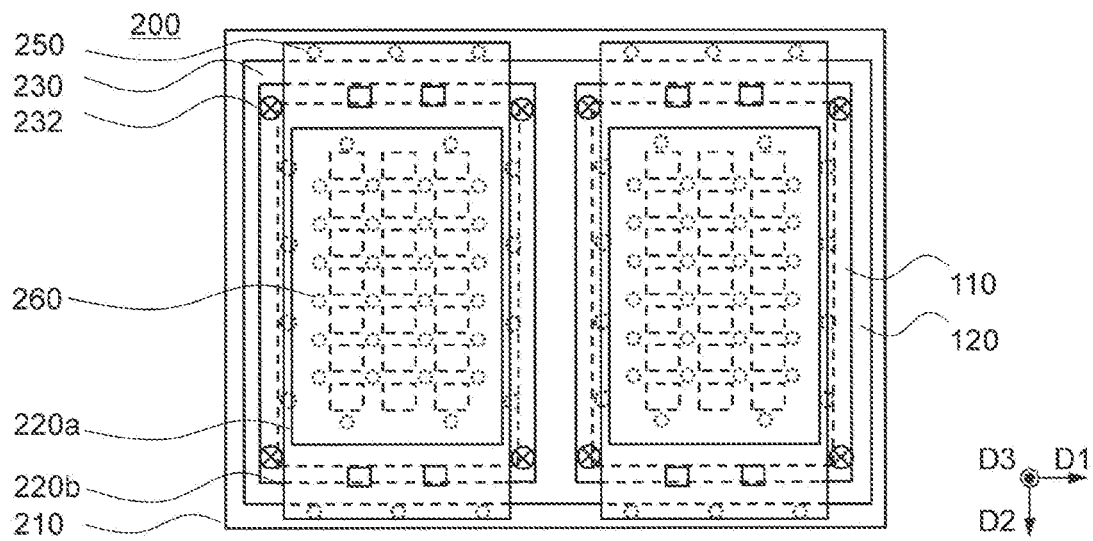
FIG. 8A is a top view diagram showing a manufacturing method of a mask unit related to one embodiment of the present invention.
Figure 8B:
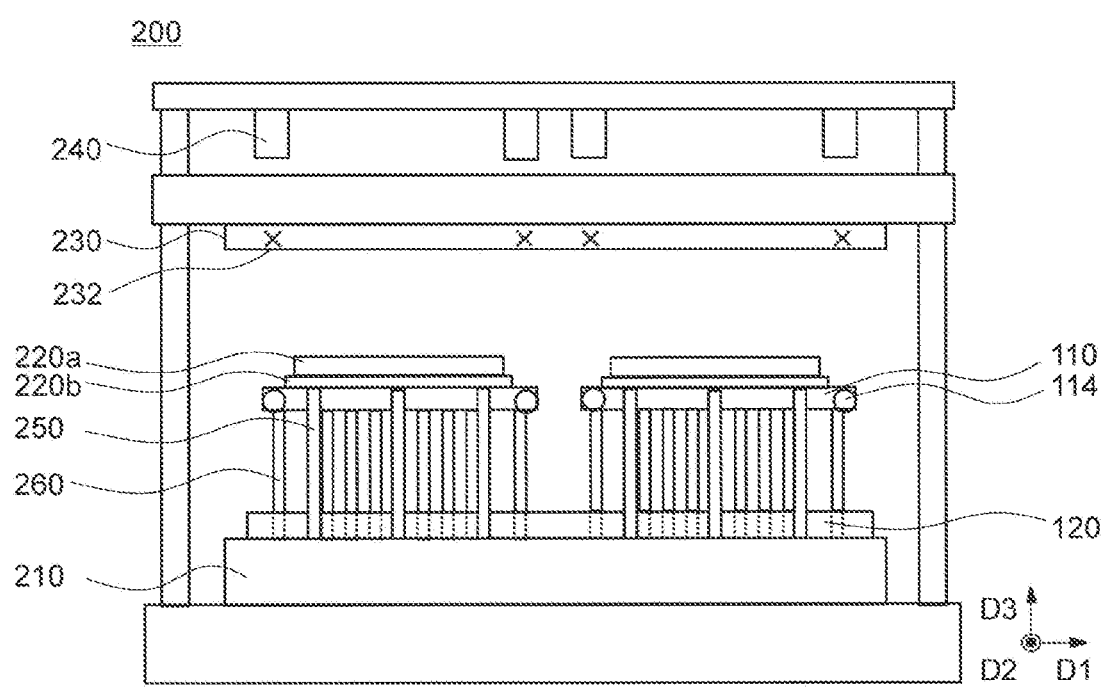
FIG. 8B is a side view diagram showing a manufacturing method of a mask unit related to one embodiment of the present invention.

FIG. 8A is a top view diagram of the mask unit manufacturing device 200 in a state where the mask holding unit 220 lifts the mask 110 by adsorption. FIG. 8B is a side view diagram of the mask unit manufacturing device 200 in the same state.

As is shown in FIG. 8A and FIG. 8B, the first lift pin 250 moves upwards in the direction D3 from the alignment stage 210a and the mask holding unit 220 is raised. Furthermore, the stage 210 (alignment stage 210a) is arranged with a plurality of second lift pins 260. The second lift pins 260 move up from the alignment stage 210a in the direction D3 and contact the mask 110. Furthermore, the second lift pins 260 raise the mask 110 thereby forming a space between the stage 210 and the mask 110. The second lift pins 260 are arranged in an area other than a position corresponding to the mask pattern portion 112 of the mask 110 in order to contact the mask 110. The second lift pins 260 are preferably arranged in an area other than a position which corresponds to the display panel of the mask 110. In the present embodiment, the second lift pins 260 are arranged between the plurality of first lift pins 250. The second lift pins 260 are arranged in the opening 122 of the frame 120. The plurality of first lift pins 250 and the plurality of second lift pins 260 move up and down in synchronization in the direction D3 from the alignment stage 210a.

Furthermore, it is possible for the first lift pins 250 to move in the direction of D1-D2 on the outer side of the frame 120. It is possible for the second lift pins 260 to move in the D1-D2 plane direction on the inner side of the opening 122 of the frame 120. The plurality of first lift pins 250 and the plurality of second lift pins 260 move in synchronization with the alignment stage 210a in the D1-D2 plane direction. By adopting this structure, it is possible for the alignment stage 210a, the first lift pins 250 and the second lift pins 260 to integrally rotate the mask holding unit 220 and the mask 110 in the D1-D2 plane surface direction or the reverse direction D3.

The first lift pins 250 contact the mask holding unit 220, and the second lift pins 260 contact the mask 110. As a result, when the first lift pins 250 and the second lift pins 260 move up, the tip end of the first lift pins 250 are higher than the tip end of the second lift pins 260 by the thickness of the mask 110 in the direction D3. That is, range by which the first lift pins 250 move up with respect to the alignment stage 210a is larger than the range by which the second lift pins 260 move up with respect to the alignment stage 210a. The first lift pins 250 and the second lift pins 260 maintain this difference in height when they move up and down in synchronization in the direction D3 from the alignment stage 210a described above and when moving in synchronization in the plane direction D1-D2. By adopting this structure, the alignment stage 210a, the first lift pins 250 and the second lift pins 260 can integrally move the mask holding unit 220 and the mask 110 in direction D3, in the plane direction D1-D2 and in a rotation direction with the direction D3 as axes in parallel with the frame 120 (plane direction D1-D2). In addition, the mask holding unit 220 and the second lift pins 260 can maintain the mask 110 substantially flat.

The camera 240 images the positions of the second reference mark 232 and the first reference mark 114 in order to align the reference plate 230 and the mask 110. The alignment stage 210a, the first lift pins 250 and the second lift pins 260 move the mask holding unit 220 and the mask 110 in the plane direction D1-D2 and thereby alignment of the second reference mark 232 of the reference plate 230 and the first reference mark 114 of the mask 110 is performed. Here, the alignment stage 210a, the first lift pins 250 and the second lift pins 260 can function as an alignment means. By adopting this structure, it is possible for the camera 240, the alignment stage 210a, the first lift pins 250 and the second lift pins 260 to align the second reference mark 232 and the first reference mark 114 with high accuracy.

Figure 9A:
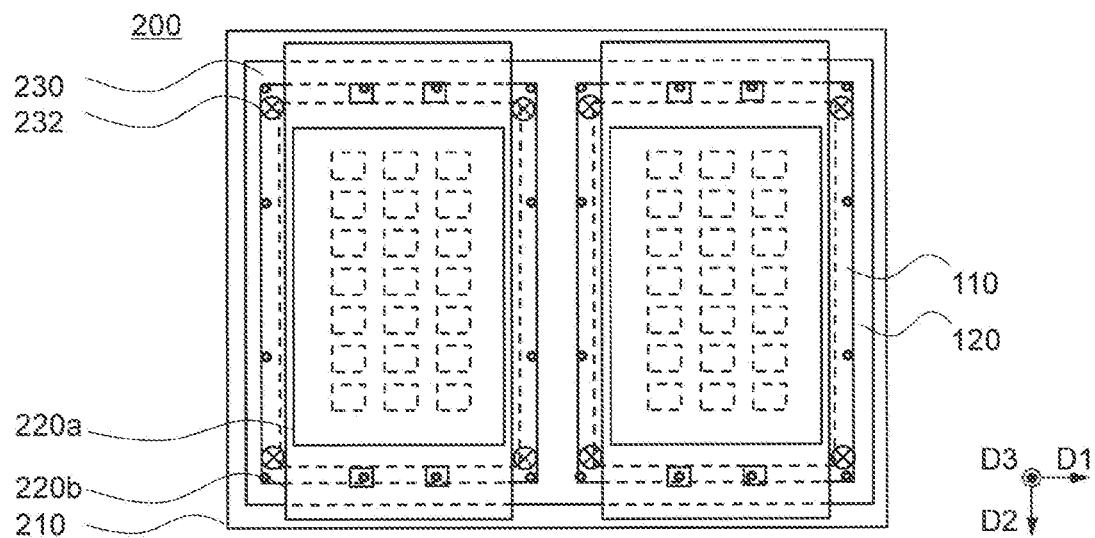
FIG. 9A is a top view diagram showing a manufacturing method of a mask unit related to one embodiment of the present invention.
Figure 9B:
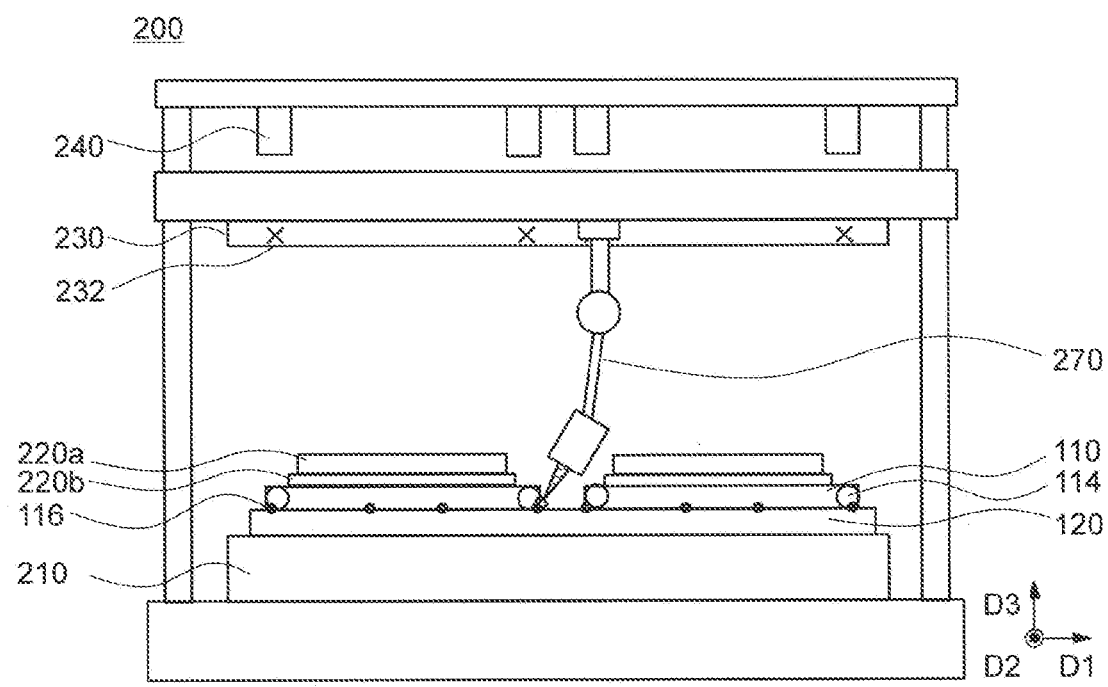
FIG. 9B is a side view diagram showing a manufacturing method of a mask unit related to one embodiment of the present invention.

FIG. 9A is a top view diagram of the mask unit manufacturing device 200 in which the mask 110 and the mask holding unit 220 are lowered and the mask 110 is welded to the frame 120. FIG. 9B is a side view diagram of the mask unit manufacturing device 200 in which the mask 110 and the mask holding unit 220 are lowered and the mask 110 is welded to the frame 120.

As is shown in FIG. 9A and FIG. 9B, when the positions of the second reference mark 232 and the first reference mark 114 are aligned, the first lift pin 250 and the second lift pin 260 are lowered in the reverse direction D3 of the alignment stage 210a and the mask holding unit 220 and the mask 110 are lowered. The plurality of first lift pins 250 and the plurality of second lift pins 260 move down in synchronization in the reverse direction D3 of the alignment stage 210a. By adopting this structure, the first lift pin 250 and the second lift pin 260 can integrally lower the mask holding unit 220 and the mask 110 in parallel to the plane direction D1-D2 in the reverse D3 direction. In addition, it is possible for the mask holding unit 220 and the second lift pins 260 to maintain the mask 110 substantially flat.

The alignment mask 110 is fixed to the frame 120 by a welder 270. The mask 110 is spot welded to the frame 120 at a fixed point 116 using a laser of the welder 270. The outer dimensions of the contact plate 220b of the mask holding unit 220 in the direction D2 are larger than the outer dimensions of the frame 120. As a result, welding of the mask 110 and the frame 120 may be carried out via the opening 222b of the contact plate 220b. The mask 110 which is welded to the frame 120 is subsequently removed from the mask unit manufacturing device 200 and thereby a mask unit 100 is provided which can be used for vapor deposition.

According to the manufacturing method of the mask unit 100 in the present embodiment, it is possible to fix a mask to a frame with a higher degree of accuracy by holding the mask 110 substantially flat from the side opposite to the stage 210 using the mask holding unit 220.

Second Embodiment

The structure of the mask unit related to the present embodiment is the same as the structure of the mask unit related to the first embodiment. In the manufacturing method of the mask unit related to the present embodiment, instead of raising the mask 110 and the mask holding unit 220 using the plurality of first lift pins 250 and the plurality of second lift pins 260 (refer to FIG. 8A and FIG. 8B), the mask 110 and the mask holding unit 220 are raised by the first lift pins 250 (refer to FIG. 10A and FIG. 10B). The remaining structure is the same as the manufacturing method of the mask unit related to the first embodiment. An explanation which is the same as the first embodiment is omitted, and parts which are different from the manufacturing method of the mask unit related to the first embodiment are explained.

<Operation of Mask Unit Manufacturing Device and Manufacturing Method of Mask Unit>

Figure 10A:
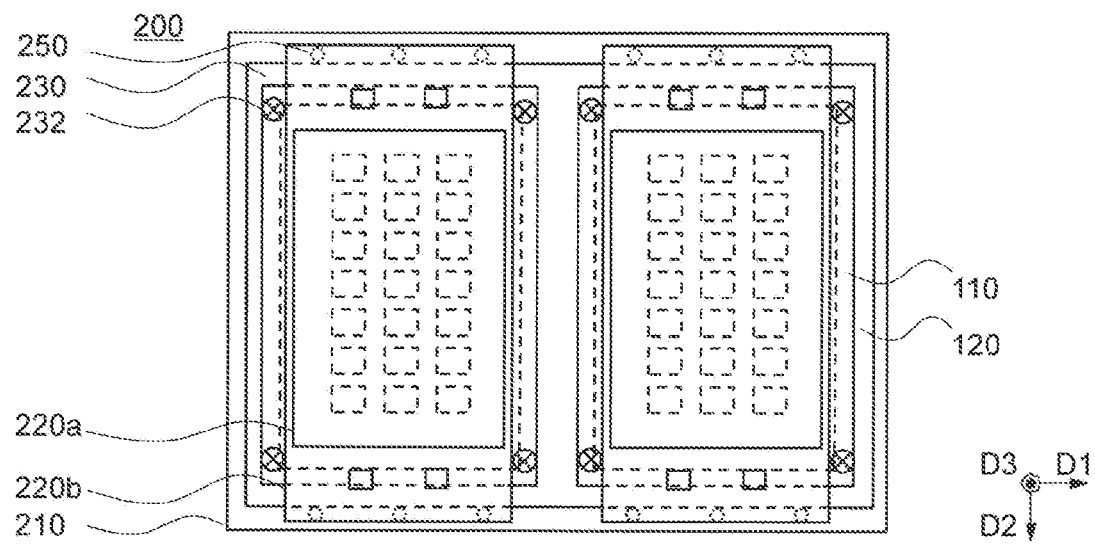
FIG. 10A is a top view diagram showing a manufacturing method of a mask unit related to one embodiment of the present invention.
Figure 10B:
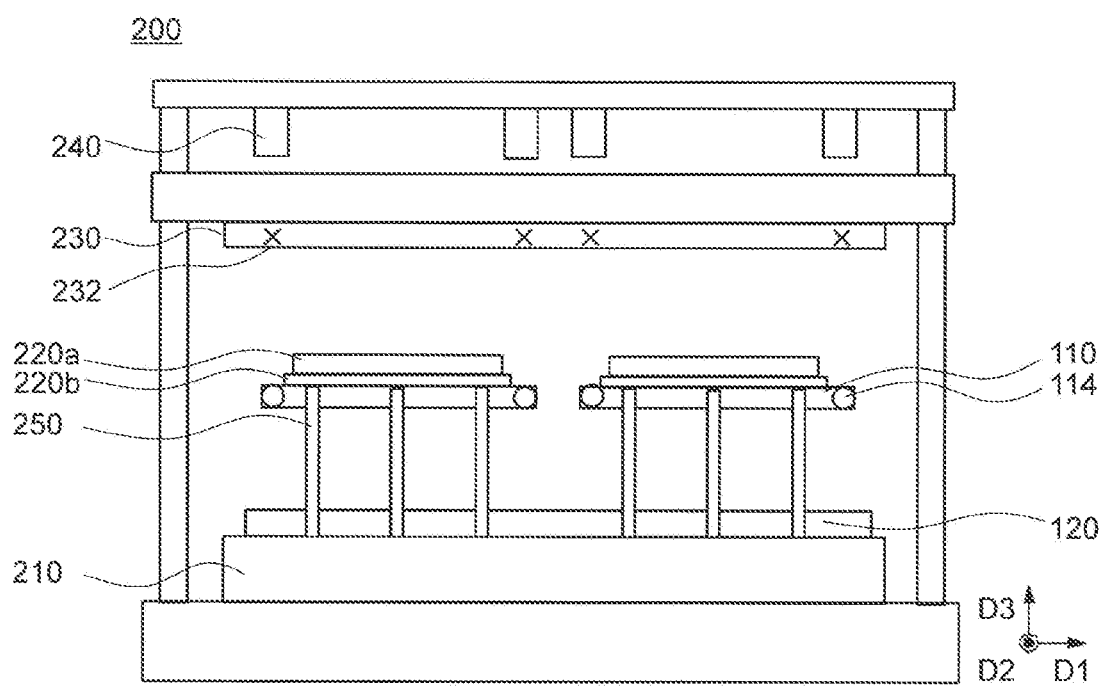
FIG. 10B is a side view diagram showing a manufacturing method of a mask unit related to one embodiment of the present invention.

FIG. 10A is a top view diagram of the mask unit manufacturing device 200 in which the mask 110 and the mask holding unit 220 are raised. FIG. 10B is a side view diagram of the mask unit manufacturing device 200 in which the mask 110 and the mask holding unit 220 are raised.

As is shown in FIG. 10A and FIG. 10B, the first lift pins 250 move up from the alignment stage 210a in the direction D3 and contact the contact plate 220b of the mask holding unit 220. The first lift pins 250 raise the mask holding unit 220. In the present embodiment, the mask holding unit 220 holds the mask 110 from the first surface 110a side by the magnetic force of the magnetic field generator 220a even without the support of the second lift pins 260. That is, the mask 110 is raised integrally with the mask holding unit 220 together with the rising of first lift pins 250 from the alignment stage 210a.

Furthermore, it is possible for the first lift pins 250 to move in the plane direction D1-D2 on the outer side of the frame 120. The plurality of first lift pins 250 move in synchronization with the alignment stage 210a in the plane direction D1-D2. It is possible for the alignment stage 210a and the first lift pins 250 to integrally move the mask holding unit 220 and the mask 110 in the plane direction D1-D2.

By adopting this structure, the alignment stage 210a and the first lift pins 250 can integrally move the mask holding unit 220 and the mask 110 in direction D3, in parallel to the plane direction D1-D2 and in parallel to a rotation direction with the direction D3 as axes.

According to the manufacturing method of the mask unit 100 of the present embodiment explained above, for example, even if the second surface 110b of the mask 110 has a concave/convex structure, it is possible to align the mask with a high degree of accuracy and fix the mask to a frame.

Third Embodiment

The structure of the mask unit related to the present embodiment is the same as the structure of the mask unit related to the first embodiment. In the manufacturing method of the mask unit related to the present embodiment, instead of raising the mask 110 and the mask holding unit 220 using the plurality of first lift pins 250 and the plurality of second lift pins 260 (refer to FIG. 8A and FIG. 8B), the mask 110 and the mask holding unit 220 are raised by the second lift pins 260 (refer to FIG. 11A and FIG. 11B). The remaining structure is the same as the manufacturing method of the mask unit related to the first embodiment. An explanation which is the same as the first embodiment is omitted, and parts which are different from the manufacturing method of the mask unit related to the first embodiment are explained.

<Operation of Mask Unit Manufacturing Device and Method of Manufacturing Mask Unit>

Figure 11A:
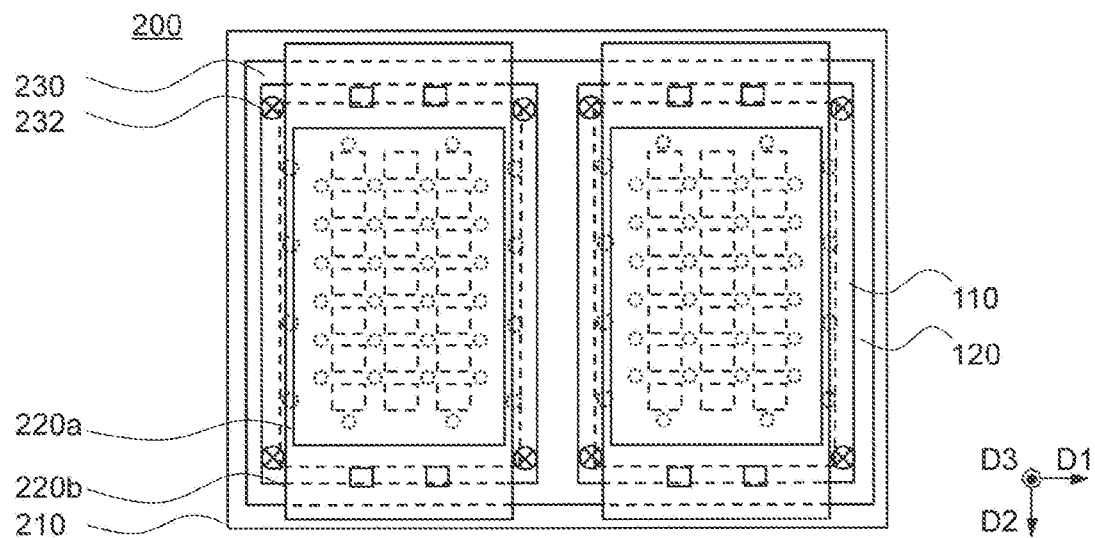
FIG. 11A is a top view diagram showing a manufacturing method of a mask unit related to one embodiment of the present invention.
Figure 11B:
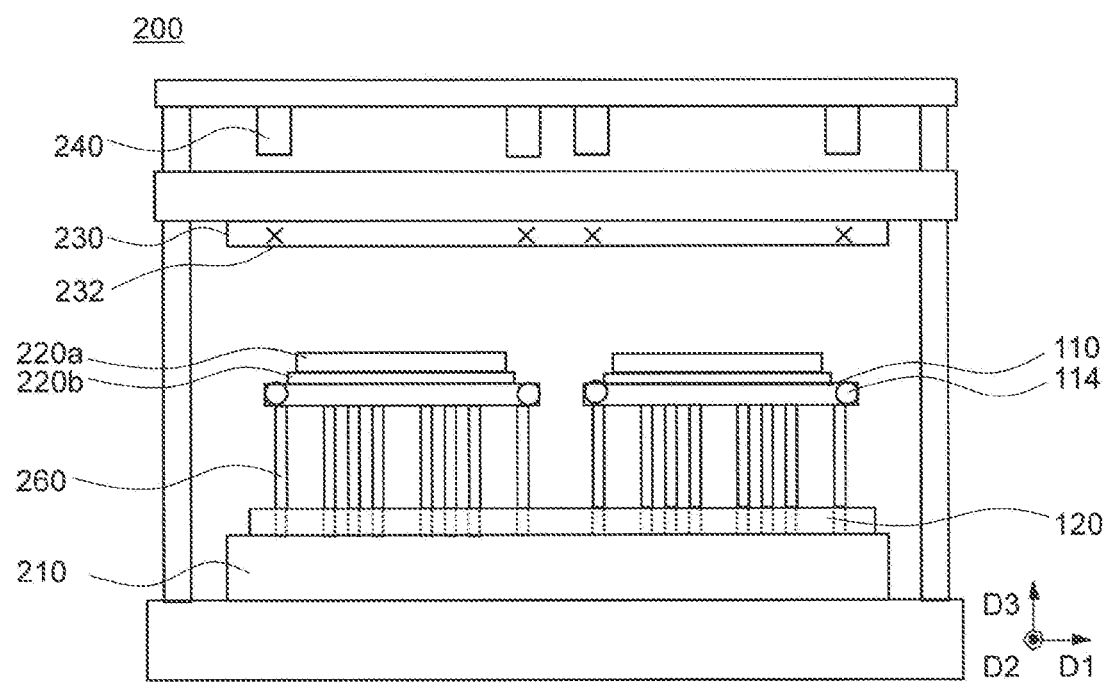
FIG. 11B is a side view diagram showing a manufacturing method of a mask unit related to one embodiment of the present invention.

FIG. 11A is a top view diagram of the mask unit manufacturing device 200 in which the mask 110 and the mask holding unit 220 are raised. FIG. 11B is a side view diagram of the mask unit manufacturing device 200 in which the mask 110 and the mask holding unit 220 are raised.

As is shown in FIG. 11A and FIG. 11B, the second lift pins 260 move up from the alignment stage 210a in the direction D3 and contact the mask 110. The second lift pins 260 raise the mask 110. In the present embodiment, the mask holding unit 220 is supported by the second lift pins 250 via the mask 110 even without the support of the first lift pins 250. That is, the mask holding unit 220 is raised integrally with the mask 110 together with the rising of second lift pins 260 from the alignment stage 210a.

Furthermore, it is possible for the second lift pins 260 to move in the plane direction D1-D2 on the inner side of the opening 122 of the frame 120. The plurality of second lift pins 260 move in synchronization with the alignment stage 210a in the plane direction D1-D2. The alignment stage 210a and the second lift pin 260 can integrally move the mask holding unit 220 and the mask 110 in the plane direction D1-D2 by a sufficient magnetic force of the magnetic field generator 220a.

By adopting this structure, the alignment stage 210a and the second lift pins 260 can integrally move the mask holding unit 220 and the mask 110 in direction D3, in parallel to the plane direction D1-D2 and in parallel to a rotation direction with the direction D3 as axes.

According to the manufacturing method of the mask unit 100 of the present embodiment explained above, it is possible to align the mask with a high degree of accuracy and fix it to a frame.

Although one embodiment of the present invention was explained above, it is possible for one embodiment of the present invention to be modified into various forms as described below.

Modified Example 1

Figure 12:
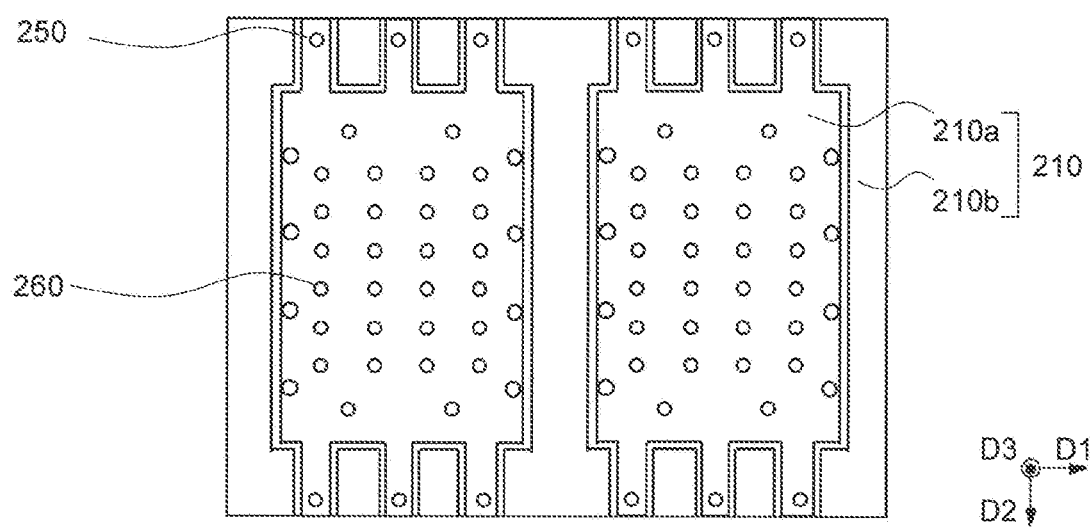
FIG. 12 is a top view diagram showing a structure of a stage of manufacturing device of a mask unit related to a modified example of the present invention.

As is shown in FIG. 3A and FIG. 3B, in the first to third embodiments, the alignment stage 210a has a rectangular shape and the frame holding stage 210b has a frame shape in order to surround the alignment stage 210a. As a result, a part of the frame 120 also contacts the alignment stage 210a. However, the present invention is not limited to this structure and it is sufficient that in the alignment stage 210a, the plurality of first lift pins 250 are arranged on the outer side of the frame 120 and the plurality of second lift pins 260 are arranged in the opening 122 of the frame 120. It is sufficient that the frame holding stage 210b is able to stably hold the frame 120. For example, FIG. 12 is a top view diagram of a stage 210 related to a modified example of the present invention. As is shown in FIG. 12, the alignment stage 210a may also protrude into a shape which includes a plurality of the first lift pins 250. The frame holding stage 210b may also be recessed in order to avoid the plurality of first lift pins 250 and may be discontinuous. By this type of arrangement, it is possible to further increase the area where the frame holding stage 210b holds the frame 120.

Modified Example 2

In the first to third embodiments, the mask holding unit 220 is formed to hold the first surface 110a of the mask 110 by a magnetic force. However, the present invention is not limited to this structure and the mask holding unit 220 may also be formed to hold the first surface 110a of the mask 110 by a vacuum suction force. In this case, the mask holding unit 220 may be arranged with a vacuum suction machine and a contact plate. The contact plate may be arranged with a suction hole and be substantially flat. By adopting this structure, the manufacturing method of the mask unit 100 related to the present modified example can realize alignment of the mask with a high degree of accuracy and fix the mask to a frame.

What is claimed is:

1. A manufacturing device for a mask unit having a mask frame and a mask fixed to the mask frame, the device comprising:
a stage including a frame holding stage for holding the frame, and an alignment stage arranged with a plurality of lift-pins;
a reference plate holder arranged facing the stage;
a mask holder arranged between the stage and the reference plate; and
a camera for imaging a direction of the stage passing through the reference plate;
wherein
the mask holder holds the mask at a surface which faces to the frame;
the mask holder is arranged with an electromagnet and a contact plate between the mask and the electromagnet;
the mask holder rises and falls above the alignment stage by the plurality of the lift-pins;
the plurality of lift-pins includes a plurality of first lift-pins capable of contacting the mask holder; and
the camera images a first reference marker formed on the mask and a second reference marker formed on the reference plate.

2. The manufacturing device according to claim 1, wherein the plurality of first lift-pins are arranged on an outer side of the frame, rise and fall with respect to the alignment stage, and rise and drop the mask holder above the alignment stage.

3. The manufacturing device according to claim 1, wherein the plurality of first lift-pins rise and fall in synchronization with each other.

4. The manufacturing device according to claim 1, wherein the plurality of lift-pins further includes a plurality of second lift-pins capable of contacting the mask.

5. The manufacturing device according to claim 4, wherein the frame includes an opening, and the plurality of second lift-pins are arranged on an inner side of the frame, rise and fall with respect to the alignment stage, and rise and drop the mask above the alignment stage.

6. The manufacturing device according to claim 4, wherein the plurality of second lift-pins rise and fall in synchronization with each other.

7. The manufacturing device according to claim 4, wherein the rise and fall range of the plurality of first lift-pins with respect to the alignment stage is larger than the rise and fall range of the plurality of second lift-pins with respect to the alignment stage.

8. The manufacturing device according to claim 1, wherein the frame holding stage and the alignment stage are separated by a gap, and the alignment stage moves within the gap.

9. The manufacturing device according to claim 1, wherein the area of the electromagnet is smaller than the area of the mask.

10. The manufacturing device according to claim 1, wherein a surface of the contact plate in contact with the mask is flat.

11. The manufacturing device according to claim 1, wherein a surface of the mask in contact with the mask holder is flat.

12. The manufacturing device according to claim 1, wherein the stage includes a plurality of alignment stages, and a plurality of the mask holders is arranged between the stage and the reference plate to hold a plurality of the masks.

13. The manufacturing device according to claim 12, wherein the mask holding stage and the plurality of alignment stages are separated by a gap, and the plurality of alignment stages is each capable of moving independently within the gap.

14. The manufacturing device according to claim 1, further comprising a welder, wherein the welder is configured to weld the frame and the mask.

* * * * *